(12) United States Patent
Suh (10) Patent No.: US 6,269,029 B1
(45) Date of Patent: Jul. 31, 2001

(54) SEMI-CONDUCTOR MEMORY DEVICE

(75) Inventor: Jung Won Suh, Kyoungki-do (KR)

(73) Assignee: Hyundai Electronics Industries, Co., Ltd., Kyoungki-do (KR)

( * ) Notice: Subject to any disclaimer, the term of this patent is extended or adjusted under 35 U.S.C. 154(b) by 0 days.

(21) Appl. No.: 09/607,194

(22) Filed: Jun. 28, 2000

(30) Foreign Application Priority Data

Jun. 29, 1999 (KR) .................................................. 99-25352

(51) Int. Cl.⁷ ...................................................... G11C 7/00
(52) U.S. Cl. .............................. 365/189.06; 365/189.07; 365/193; 365/189.11
(58) Field of Search ........................ 365/189.06, 189.07, 365/193, 189.11

(56) References Cited

U.S. PATENT DOCUMENTS

| | | | |
|---|---|---|---|
| 5,216,637 | 6/1993 | Vaillancourt | 365/230.03 |
| 5,260,904 | 11/1993 | Miyawaki et al. | 365/189.06 |
| 5,265,053 | 11/1993 | Naradone et al. | . |
| 5,513,135 | 4/1996 | Dell et al. | 365/52 |
| 5,657,292 | 8/1997 | McClure | 365/233 |
| 5,717,646 | 2/1998 | Kyi | 365/230.95 |
| 5,808,500 | 9/1998 | Kalpakjian | 327/321 |
| 5,886,943 | 3/1999 | Sekiguchi et al. | 365/236.03 |
| 5,910,914 * | 6/1999 | Wang | 365/185.21 |
| 5,936,895 * | 8/1999 | Shirley | 365/189.07 |
| 5,974,499 | 10/1999 | Norman et al. | 711/103 |
| 5,982,674 | 11/1999 | Lines et al. | 365/189.02 |
| 6,002,632 | 12/1999 | Krueger | 365/230.03 |

FOREIGN PATENT DOCUMENTS

| | | |
|---|---|---|
| 02134797 | 5/1990 | (JP) . |
| 04106793 | 4/1992 | (JP) . |

* cited by examiner

Primary Examiner—David Nelms
Assistant Examiner—Connie C. Yoha
(74) Attorney, Agent, or Firm—Pillsbury Winthrop LLP (57) ABSTRACT

The present invention relates to a semi-conductor memory device, comprises global data bus lines and single data strobe lines and reference comparing voltage lines with the number being identical to the number of data being coupled between a bank and an input, output interface circuit part; a clamping means connected every each line for fixing the numerous global data bus lines and the data strobe lines and the reference comparing voltage lines to a regular level of an electric potential; a first to a third driving means connected to every ends of both sides of the numerous global data bus lines and the data strobe lines and the reference comparing voltage lines, for controlling a drive of each lines by a combination of an input, output enable signal and a data output strobe signal and each data signal; a first receiving means connected to ends of both sides of the data strobe lines, for receiving a strobe signal carried on the data strobe lines and comparing it with a reference comparing voltage and thereby outputting the data strobe signal; a second receiving means connected to respective ends of both sides of the numerous global data bus lines, for comparing each data signal with a reference comparing voltage signal and outputting each data value under a control of a data strobe signal being outputted from the first receiving means.

7 Claims, 6 Drawing Sheets

SEMI-CONDUCTOR MEMORY DEVICE

BACKGROUND OF THE INVENTION

1. Field of the Invention

The present invention relates to a semi-conductor memory device, particularly to a semi-conductor memory device which realized an operation of low power and high speed by transferring data in a low voltage width by way of a data bus line structure pipelined.

2. Description of the Related Art

Generally, a DRAM being used as a main memory of a computer and a graphic memory requires a high band width for an enhancement of a performance of a system, a circuit structure of a method that an internal operational frequency of a DRAM is increased or of a pipeline and prefetch method is used to satisfy this requirements.

However, as an internal operation speed of a DRAM has a limit because of an internal operational principle of a word line access and sensing, a method that a number of data are transferred and outputted simultaneously to an input, output interface circuit in advance by many data bus lines is applied and a required band width is realized.

Therefore, in a memory device requiring a high speed operation such as a synchronous DRAM, D.D.R. SDRAM, Rambus DRAM, said prefetch method is used in an internal circuit, data bus lines of the number of 128 bits or more than 128 bits may be used to satisfy a band width required in a logic circuit even in an embedded memory device having a DRAM device therein.

However, a data bus line structure of a prior semi-conductor memory device generally transfers one datum to two lines, is composed of a structure using a signal of CMOS level(at this time, a CMOS level indicates a ground electric potential(Vss) and an electric power potential(Vdd)), there was a problem that this data bus line structure is inappropriate to cope with a high speed operation of more than 150 MHz, a consumption of an electric power increases very rapidly in a case that many data bus lines are used.

Figure 1:
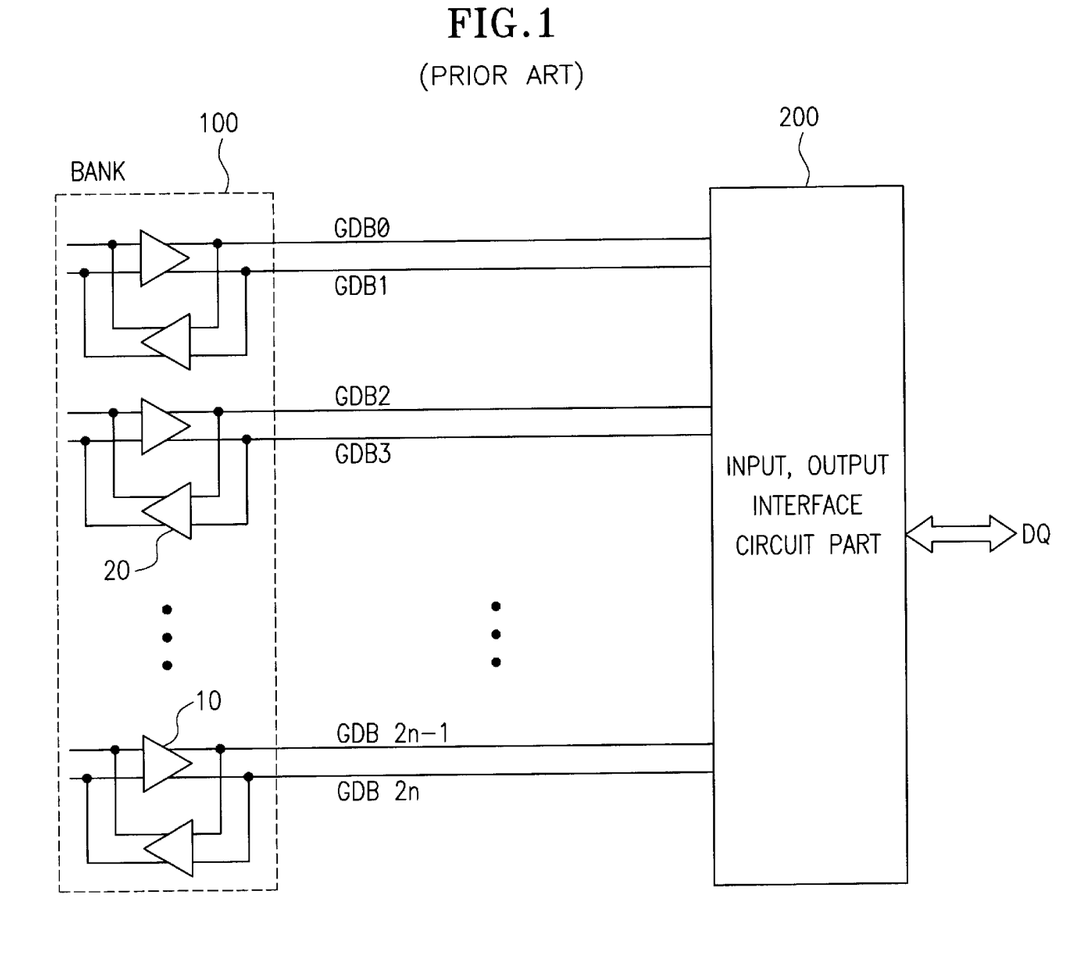
FIG. 1 shows a data bus line structure of a prior semi-conductor memory device.

FIG. 1 shows a data bus line structure of a prior semi-conductor memory device. Referring to FIG. 1, the structure of FIG. 1 has a structure that two global data bus lines transfer one datum, this structure is composed of 2n global data bus lines for transferring n data between a bank 100 composed of numerous memory cells and an input, output interface circuit part 200.

Also, the bank 100 and the input, output interface circuit part 200 comprise n driving means 10 for driving each global data bus line, a data receiving means 20 for receiving two data carried respectively on two global data bus lines driven by the driving means 10 and comparing them and discriminating the data values as much as the number of data.

However, as described above, though a prior semi-conductor memory device had an advantage that a strong operation characteristic to a common mode noise by a data bus line structure using two data bus lines every each data for transferring data, a prior semi-conductor memory device had a drawback that an internal area of a chip increases considerably.

Also, in a case of a global data bus line being used generally, as it is composed of very long metal lines and a capacitance of a line is large considerably, in the case that numerous CMOS level data are transferred simultaneously via a number of global data bus lines, there was a problem that a considerable electric power consumption generates, and that it is difficult to cope with a high speed operation of more than 150 MHz due to a long consumption time of pre-charging.

SUMMARY OF THE INVENTION

The present invention is invented to solve the problem, it is an object of the present invention to provide a semi-conductor memory device realizing a low power consumption and a high speed operation by using a single global data bus line every each data and clamping an amplitude of a voltage to a level of an electric power voltage and using it.

To accomplish said object, a semi-conductor memory device according to the present invention comprises:

global data bus lines and single data strobe lines and reference comparing voltage lines with the number being identical to the number of data being coupled between a bank and an input, output interface circuit part;

a clamping means connected every each line for fixing the numerous global data bus lines and the data strobe lines and the reference comparing voltage lines to a regular level of an electric potential;

a first to a third driving means connected to every ends of both sides of the numerous global data bus lines and the data strobe lines and the reference comparing voltage lines, for controlling a drive of each lines by a combination of an input, output enable signal and a data output strobe signal and each data signal;

a first receiving means connected to ends of both sides of the data strobe lines, for receiving a strobe signal carried on the data strobe lines and comparing it with a reference comparing voltage and thereby outputting the data strobe signal;

a second receiving means connected to respective ends of both sides of the numerous global data bus lines, for comparing each data signal with a reference comparing voltage signal and outputting each data value under a control of a data strobe signal being outputted from the first receiving means.

Also, a semi-conductor memory device according to the present invention further comprises multiple pre-charge means connected to the global data bus lines and the data strobe lines respectively for pre-charging a data bus line by the clamping means in a high speed.

DETAILED DESCRIPTION OF THE INVENTION

Hereinafter, a preferred embodiment of the present invention will be explained in more detail with reference to the accompanying drawings.

Figure 2:
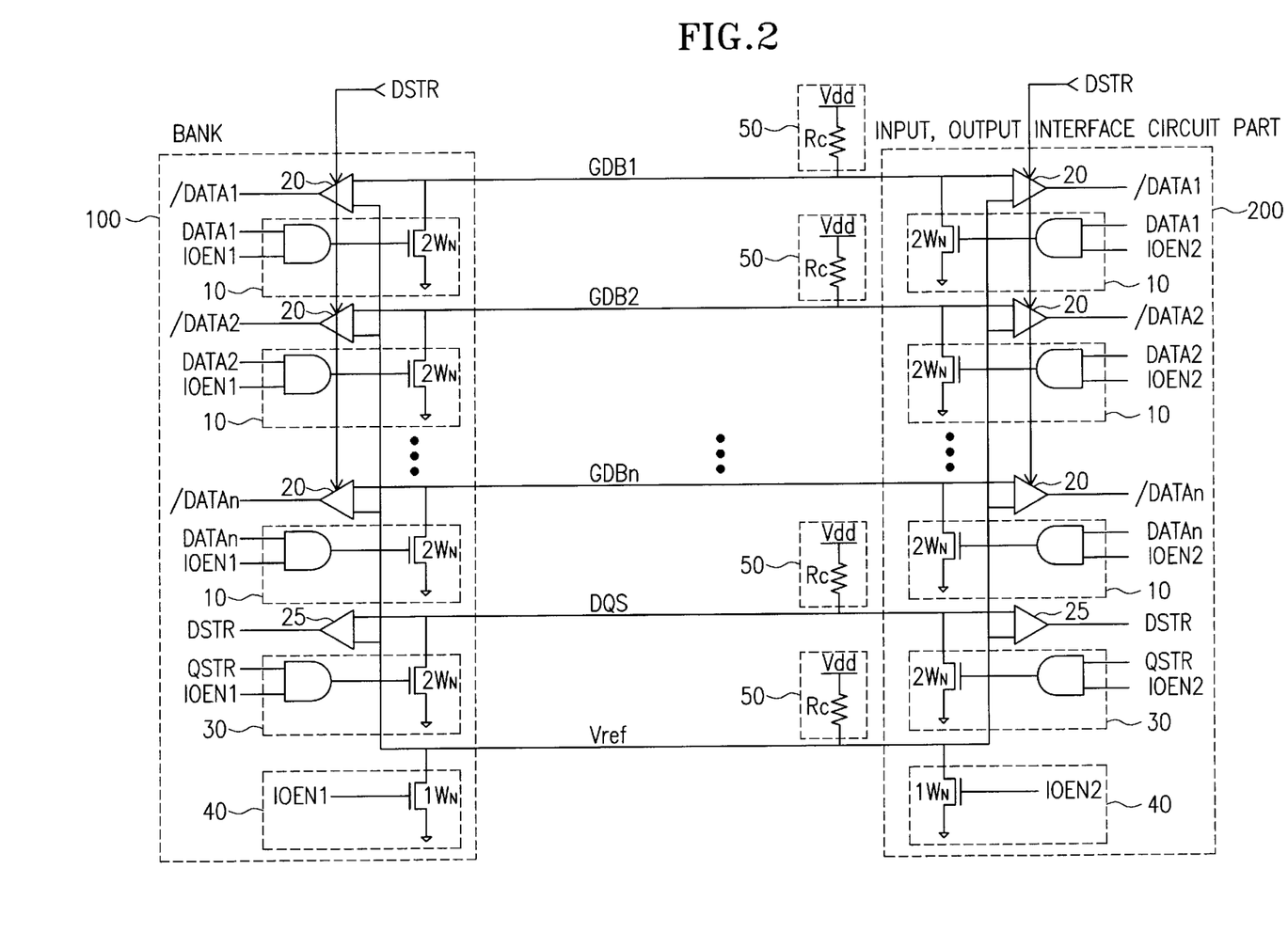
FIG. 2 shows a data bus line structure of a semi-conductor memory device according to a first embodiment of this invention.

FIG. 2 shows a data bus line structure of a semi-conductor memory device according to a first embodiment of this invention.

As drawn in FIG. 2, a semi-conductor memory device according to this invention comprises global data bus lines GDB1~GDBn and single data strobe lines DQS and reference comparing voltage lines Vref with the number(n) being identical to the number of data being coupled between a bank 100 and an input, output interface circuit part 200; a clamping means 50 connected to every each line for fixing the numerous global data bus lines GDB1~GDBn and the data strobe lines DQS and the reference comparing voltage lines Vref to a regular level of an electric potential; a first to a third driving means 10, 30, 40 connected to every ends of both sides of the numerous global data bus lines GDB1~GDBn and the data strobe lines DQS and the reference comparing voltage lines Vref, for controlling a drive of each lines by a combination of an input, output enable signal IOEN and a data output strobe signal QSTR and each data signal DATA1~DATAn; a first receiving means 25 connected to ends of both sides of the data strobe lines DQS, for receiving a strobe signal carried on the data strobe lines DQS and comparing it with a reference comparing voltage Vref and thereby outputting the data strobe signal DSTR; a second receiving means 20 connected to respective ends of both sides of the numerous global data bus lines GDB1~GDBn, for comparing each data signal DATA1~DATAn with a reference comparing voltage signal Vref and outputting each data value under a control of a data strobe signal DSTR being outputted from the data strobe receiving means 25.

The clamping means 50 has a clamping resistor Rc connected between an apply stage of an electric voltage Vdd and respective lines.

The first and the second receiving means comprises a current mirror-type differential amplifier receiving the data strobe signal and each data signal as a first input, and the reference comparing voltage as a second input.

Also, a respective data driving means 10, a data strobe driving means 30, a comparing voltage driving means 40 has an NMOS Transistor that is connected between the ends of both sides of respective lines GDB1~GDBn, DQS, Vref and a ground end Vs, each data signal DATAlDATAn and an AND combination signal of the input, output enable signal IOEN, and the input, output enable signal IOEN are inputted to a respective gate stage thereof.

At this time, a ratio of a channel width of each NMOS Transistor comprising the data driving means 10, the data strobe driving means 30, the comparing voltage driving means 40 is $2W_N: 2W_N: 1W_N$.

A next table 1 is a drawing showing each driving means.

TABLE 1

| Driving means | Channel width | Driving current | Driving signal voltage |
|---|---|---|---|
| Data driving means (10) and | $2W_N$ | $2 \times Io$ | Vdd-2Vt |

TABLE 1-continued

| Driving means | Channel width | Driving current | Driving signal voltage |
|---|---|---|---|
| data Strobe driving means (30) Comparing voltage driving means | $1W_N$ | $1 \times Io$ | Vdd-Vt |

The comparing voltage driving means 40 is turned on only when data are transferred, transfers the comparing voltage Vref of a level of an electric potential Vdd-Vt to the second receiving means 20 and the first receiving means 25 by carrying it to the reference comparing voltage line.

At this time, the s econd receiving means 20 is controlled by the data strobe signal DSTR, discriminates a data value of '1' or '0' by comparing a transferred comparing voltage Vref signal with an electric potential signal carried on the respective global data bus lines GDB1~GDBn, as the data output strobe signal QSTR is transferred simultaneously when n data are transferred, a distortion due to a transfer delay between data signals can be reduced.

Also, n data signals DATA1~DATAn and a reference comparing voltage signal Vref and a data strobe signal DSTR are transferred simultaneously in a same condition, an influence due to a common mode noise and a ground bouncing can be reduced.

And, the input, output enable signal IOEN are activated only in a part that data are transferred, e.g., only the input, output enable signal IOEN of a bank 100 is activated in the time of a transfer of data from the bank 100 to the input, output interface circuit part 200, the input, output enable signal IOEN of the input, output interface circuit part 200 aren't activated.

Figure 3:
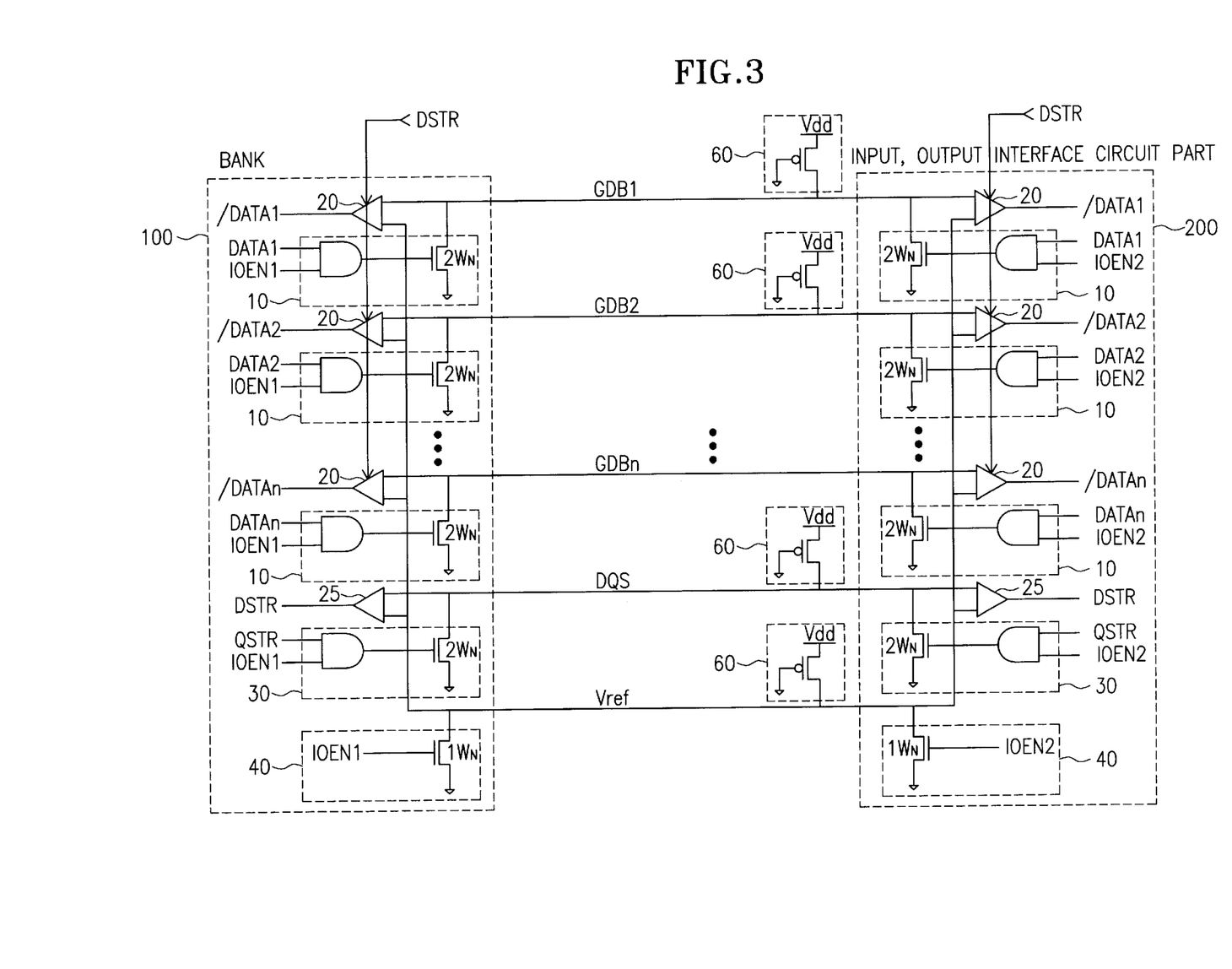
FIG. 3 shows a data bus line structure of a semi-conductor memory device according to a first embodiment of this invention.

FIG. 3 shows a data bus line structure of a semi-conductor memory device according to a first embodiment of this invention, a basic composition of FIG. 3 is identical to that of a first embodiment of FIG. 2. As there is the only difference that a PMOS Transistor Mc having a gate stage connected to a ground is used instead of a clamping resistor Rc in constructing the clamping means 60 and the remainder is same, a detail explanation of a composition is abbreviated.

Figure 4:
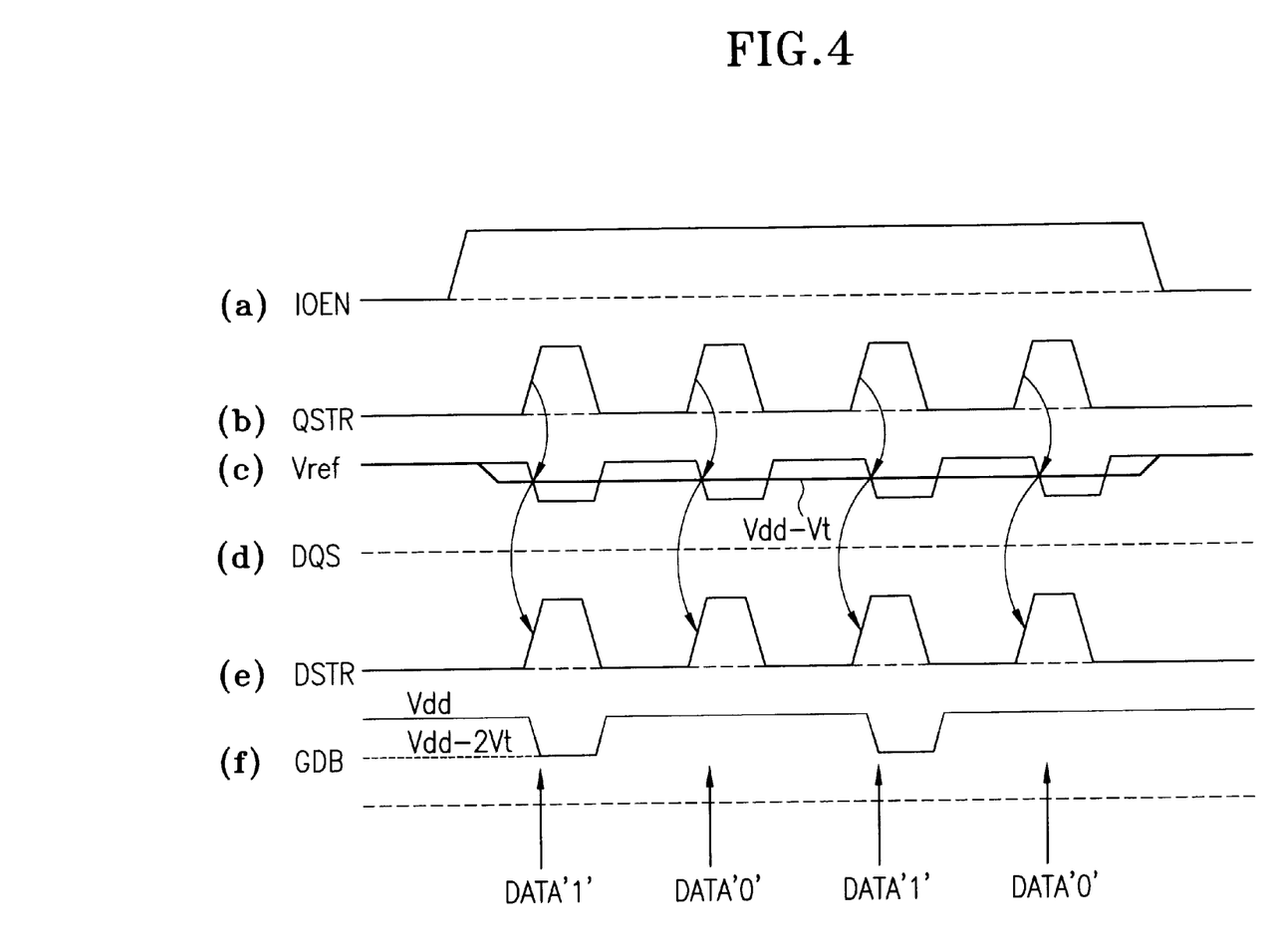
FIG. 4 shows an operation timing of a semi-conductor memory device of FIG. 2 and FIG. 3.

FIG. 4 shows an operation timing of a semi-conductor memory device of FIG. 2 and FIG. 3, this shows when data 1, 0, 1, 0 are transferred in this case.

First of all, as drawn in FIG. 4(a), if the input, output enable signal IOEN is activated to 'logic high', an NMOS Transistor forming a comparing voltage driving means 40 drives a reference comparing voltage line Vref being turned on primarily.

And, the n data signals DATA1~DATAn and the data output strobe signal QSTR are transferred respectively to the receiving means 20, 25 through the n global data bus lines GDB1~GDBn and the data strobe lines DQS.

And, as drawn in FIG. 4(e), an operation of each data receiving means 20 is controlled by the data strobe signal DSTR being activated every when data are transferred, discriminates a data value of '0' or '1' by comparing a transferred data signal with a comparing voltage signal Vref, while the input, output enable signal IOEN is activated, the comparing voltage signal Vref is transferred to the respective receiving means 20, 25 keeping up an electric potential level of 'Vdd-Vt', as drawn in FIG. 4(c).

Therefore, when data are '0', an electric potential 'Vdd' is transferred to a global data bus line GDB without changing a voltage, when data are '1', an electric potential 'Vdd-2Vt' is transferred to the global data bus line GDB as depicted in FIG. 4(f).

Figure 5:
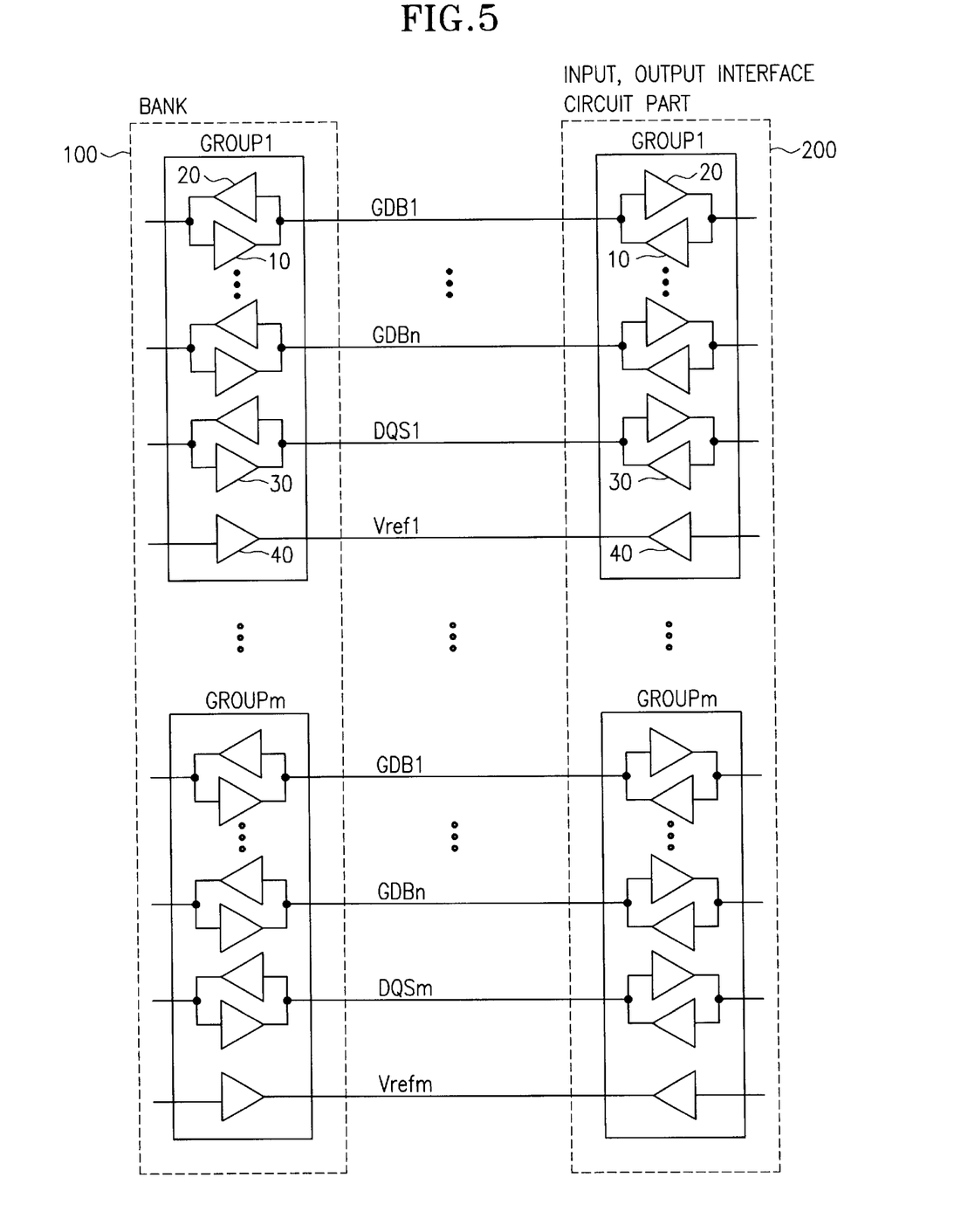
FIG. 5 is a drawing that a data bus line structure of a semi-conductor memory device according to this invention is adopted in a group.

FIG. 5 is a drawing that a data bus line structure of a semi-conductor memory device according to this invention is adopted in a group.

As drawn in FIG. 5, as there are many problems in applying a data bus line structure being used in the present invention in a semi-conductor memory device having very many data bus lines(for example, a rapid increase of a distortion between data signals and an increase of an influence of a common mode noise), if mxn multiple data bus lines are divided to m groups and n global data bus lines and n single data strobe lines and n comparing voltage lines are arranged, the problems can be removed.

Figure 6:
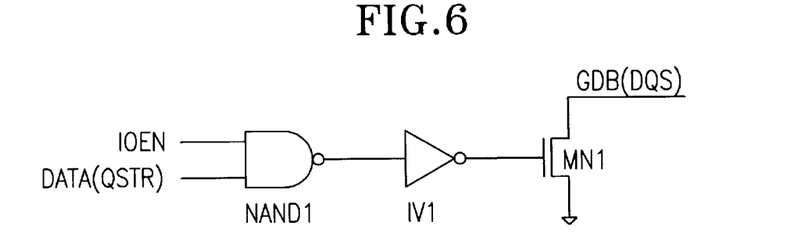
FIG. 6 is a circuit of one embodiment of a data(strobe) driving means being used in a semi-conductor memory device according to this invention.

FIG. 6 is a circuit of one embodiment of a data(strobe) driving means being used in a semi-conductor memory device according to this invention.

As drawn in FIG. 6, the data(strobe) driving means comprises a NAND GATE NAND1 for NAND combining a data signal(a strobe signal) DATA, QSTR and an inverter IV1 connected to an output stage of the NAND GATE, an NMOS Transistor MN1 with a channel width of $2W_N$ connected between each data bus line GDB and each data strobe line DQS and a ground stage and an output signal of the inverter IV1 is inputted to a gate stage thereof.

By way of said composition, turn on of the NMOS Transistor MN1 is controlled according to data or a data output strobe signal QSTR being inputted when the input, output enable signal IOEN is inputted in an activated state, thereby the electric potentials which are different respectively are carried on a global data bus line GDB and a data strobe line DQS.

Figure 7:
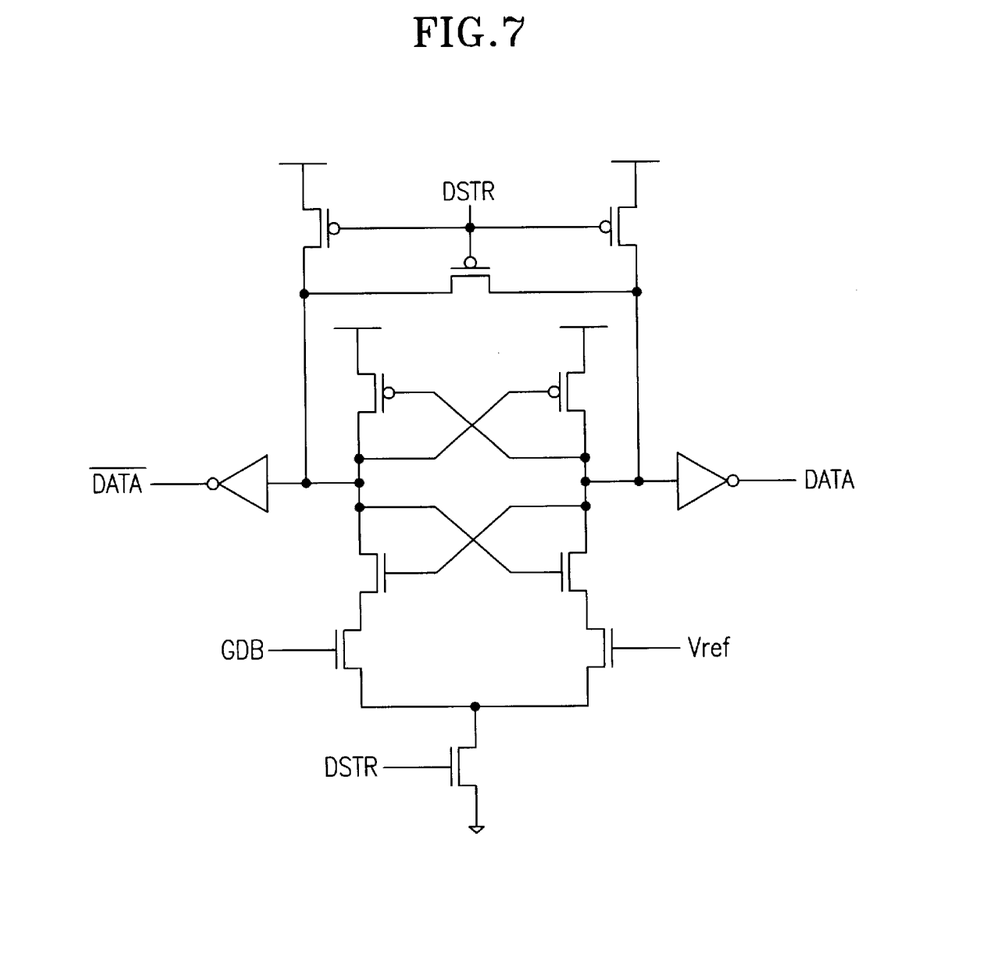
FIG. 7 is a circuit of one embodiment of a data receiving means being used in a semi-conductor memory device according to this invention.

FIG. 7 is a circuit of one embodiment of a data receiving means being used in a semi-conductor memory device according to this invention.

As drawn in FIG. 7, a data signal carried on a global data bus line GDB is compared with the reference comparing voltage Vref, a data signal value is discriminated according to the difference.

Also, in a semi-conductor memory device according to the present invention, after data of 'logic high' are transferred, multiple global data bus lines are pre-charged to a level of Vdd by the clamping means 50, 60 respectively, at this time, a further pre-charge means may be included in the respective global data bus lines GDB1~GDBn and the data strobe lines DQS to shorten the time being consumed in pre-charging.

A semi-conductor memory device according to the present invention further comprises multiple pre-charge means connected to the clamping means in parallel on the multiple global data bus lines and the data strobe lines for pre-charging respective corresponding lines to the regular level of an electric potential.

The pre-charge means receives the data strobe signal and is activated under a control of a control pulse signal generated.

A pre-charging means being used in the present invention generates a control pulse signal under a control of the data strobe signal DSTR, its operation is controlled according to the control pulse signal, a pre-charging of corresponding line is performed, as detail compositions of a pulse generating circuit and a pre-charging circuit are commonly used, its detail description is omitted.

As described above, according to a semi-conductor memory device according to the present invention, there is an economic effect that an increase of an internal area of a chip can be reduced to a half by using a data bus line of a single line every respective data being intended to transfer.

And, there is a prominent effect that to transfer a data signal and a comparing voltage signal and a data strobe signal simultaneously in a same condition is possible, thereby an effect due to a common mode noise and a ground bouncing can not only be minimized, but a distortion due to a transfer delay between data signals can be removed.

Also, there is an effect, that is, as data are transferred via a global data bus line clamped to an electric power voltage Vdd in advance, an amplitude of a voltage can be reduced, thereby a high speed operation and a low power consumption can be realized.

And, although the preferred embodiment of the present invention has been disclosed for illustrative purpose, those skilled in the art will appreciate that various modifications, additions and substitutions are possible, without departing from the scope and the spirit of the present invention as described in the accompanying claims.

What is claimed is:

1. A semi-conductor memory device comprising:
    global data bus lines and single data strobe lines and reference comparing voltage lines with the number being identical to the number of data being coupled between a bank and an input, output interface circuit part;
    a clamping means connected every each line for fixing the numerous global data bus lines and the data strobe lines and the reference comparing voltage lines to a regular level of an electric potential;
    a first to a third driving means connected to every ends of both sides of the numerous global data bus lines and the data strobe lines and the reference comparing voltage lines, for controlling a drive of each lines by a combination of an input, output enable signal and a data output strobe signal and each data signal;
    a first receiving means connected to ends of both sides of the data strobe lines, for receiving a strobe signal carried on the data strobe lines and comparing it with a reference comparing voltage and thereby outputting the data strobe signal;
    a second receiving means connected to respective ends of both sides of the numerous global data bus lines, for comparing each data signal with a reference comparing voltage signal and outputting each data value under a control of a data strobe signal being outputted from the first receiving means.

2. The semi-conductor memory device as claimed in claim 1, wherein the clamping means comprises a resistor connected between an apply stage of an electric voltage and respective lines.

3. The semi-conductor memory device as claimed in claim 1, wherein the clamping means comprises a PMOS Transistor connected between an apply stage of an electric voltage and respective lines, for having a gate stage connected to a ground.

4. The semi-conductor memory device as claimed in claim 1, wherein the first to the third driving means comprise NMOS Transistors which are connected between the ends of both sides of respective lines and a ground end, where each data signal and an AND combination signal of the input, output enable signal, the data output strobe signal and the AND combination signal of the input, output enable signal and the input, output enable signal are inputted to a respective gate stage thereof, its respective channel width ratio is 2:2:1.

5. The semi-conductor memory device as claimed in claim 1, wherein the first and the second receiving means comprise a current mirror-type differential amplifier receiving the data strobe signal and each data signal as a first input, and the reference comparing voltage as a second input.

6. The semi-conductor memory device as claimed in claim 1, wherein the semi-conductor memory device further comprises multiple pre-charge means connected to the clamping means in parallel on the multiple global data bus lines and the data strobe lines for pre-charging respective corresponding lines to the regular level of an electric potential.

7. The semi-conductor memory device as claimed in claim 1, wherein the pre-charge means receives the data strobe signal and is activated under a control of a control pulse signal generated.

* * * * *